United States Patent
Choi

(10) Patent No.: US 9,285,413 B2
(45) Date of Patent: Mar. 15, 2016

(54) APPARATUS FOR AND METHOD OF SENSING ARC IN GAS INSULATED SWITCHGEAR USING PHOTODIODE

(71) Applicant: Hyundai Heavy Industries Co., Ltd., Ulsan (KR)

(72) Inventor: Chang Kuk Choi, Gyeonggi-Do (KR)

(73) Assignee: Hyundai Heavy Industries Co., Ltd., Ulsan (KR)

( * ) Notice: Subject to any disclaimer, the term of this patent is extended or adjusted under 35 U.S.C. 154(b) by 0 days.

(21) Appl. No.: 14/510,605

(22) Filed: Oct. 9, 2014

(65) Prior Publication Data
US 2015/0103337 A1    Apr. 16, 2015

(30) Foreign Application Priority Data
Oct. 10, 2013   (KR) .................. 10-2013-0120418

(51) Int. Cl.
| | |
|---|---|
| G01J 1/00 | (2006.01) |
| G01R 31/12 | (2006.01) |
| H02B 13/065 | (2006.01) |
| H02H 1/00 | (2006.01) |
| H02H 7/22 | (2006.01) |
| G01R 31/327 | (2006.01) |

(52) U.S. Cl.
CPC .......... *G01R 31/1218* (2013.01); *G01R 31/327* (2013.01); *H02B 13/065* (2013.01); *H02H 1/0023* (2013.01); *H02H 7/222* (2013.01)

(58) Field of Classification Search
CPC .............. G01N 21/031; G01N 21/359; G01N 33/0009; G01N 19/418
See application file for complete search history.

(56) References Cited

U.S. PATENT DOCUMENTS

| | | | |
|---|---|---|---|
| 2010/0073013 A1 | 3/2010 | Zeller et al. | |
| 2012/0056637 A1* | 3/2012 | Jeong et al. | .............. 324/759.01 |
| 2012/0146623 A1 | 6/2012 | Roscoe | |

FOREIGN PATENT DOCUMENTS

| | | |
|---|---|---|
| EP | 0197778 A2 | 10/1986 |
| JP | H04127830 A | 4/1992 |
| KR | 100590801 | 6/2006 |
| KR | 10-1118375 | 2/2012 |
| KR | 10-2012-0064042 | 6/2012 |

OTHER PUBLICATIONS

Extended European Search Report for European Patent Application No. 14188101.1, dated Mar. 19, 2015.

* cited by examiner

*Primary Examiner* — Michael P Stafira
(74) *Attorney, Agent, or Firm* — Locke Lord LLP; Christopher J. Capelli; Judy Naamat

(57) ABSTRACT

There is provided an apparatus for sensing an arc in a gas insulated switchgear (GIS) including: an optical signal receiving unit receiving an optical signal generated due to an arc within a GIS; and a circuit breaker controller outputting a circuit breaker interrupt signal based on the received optical signal, wherein the optical signal receiving unit is installed within the GIS. An optical signal due to an arc may be received at the maximum level, and an arc generated within a GIS may be simply sensed at low costs.

8 Claims, 3 Drawing Sheets

# APPARATUS FOR AND METHOD OF SENSING ARC IN GAS INSULATED SWITCHGEAR USING PHOTODIODE

CROSS-REFERENCE TO RELATED APPLICATION

This application claims the benefit of Korean Patent Application No. 10-2013-0120418 filed on Oct. 10, 2013, with the Korean Intellectual Property Office, the disclosure of which is incorporated herein by reference.

BACKGROUND

The present disclosure relates to sensing an arc within a gas insulated switchgear.

In general, a gas insulated switchgear (GIS) is a device for performing a switching operation in which a fault current may be interrupted as it occurs, including a circuit breaker, a disconnecting switch, an earthing switch, a current transformer, a bus, and the like, installed in a steel enclosure (or a metal casing) filled with $SF_6$ gas having excellent insulating and arc-extinguishing characteristics. In the case that a fault current occurs, a circuit breaker in a GIS operates to break an electrical line and controls an arc generated at this time with the insulating gas.

When such a GIS is manufactured, transported, and assembled on-site, a conductor part therein may be damaged, a spacer may be cracked, a conductive foreign object, or the like, may be present therein, and these may cause an arc due to an insulation defect such as a short circuit in an electrical circuit. In particular, when a generated arc lasts for 100 ms or more, a system may be fatally damaged, and thus, an arc needs to be sensed in advance. In order to sense an arc generated within a GIS, an ultra-high frequency (UHF) sensor is largely used.

A UHF sensor relies on the principle that, when a partial discharge occurs within a GIS, a super high frequency (SHF) electromagnetic wave is leaked outwardly from the GIS. The UHF sensor may sense an internal arc by sensing an SHF electromagnetic wave leaked to outside. However, such a UHF sensor is commonly installed in a spacer outside of a GIS and may be relatively costly. In addition, a great deal of time and effort are required for post-processing calculations, such as translation of a sensed SHF signal in a frequency domain, and the like.

SUMMARY

An aspect of the present disclosure may provide an apparatus for and method of sensing an arc in a gas insulated switchgear (GIS) using a photodiode which is installed within a GIS and is capable of simply sensing an arc at low cost.

According to an aspect of the present disclosure, an apparatus for sensing an arc in a gas insulated switchgear (GIS) may include: an optical signal receiving unit receiving an optical signal generated due to an arc within a GIS; and a circuit breaker controller outputting a circuit breaker interrupt signal based on the received optical signal, wherein the optical signal receiving unit is installed within the GIS.

When the received optical signal lasts for a predetermined period of time or longer or when the received optical signals are repeatedly generated, the circuit breaker controller outputs the circuit breaker interrupt signal.

The apparatus may further include: an optical signal converting unit converting the received optical signal into a voltage signal; an amplifying unit amplifying the converted voltage signal at a predetermined amplification rate; and an offset adjusting unit adjusting an offset of the amplified voltage signal.

The apparatus may further include: an optical signal generating unit installed within the GIS.

The optical receiving unit may include a photodiode.

According to another aspect of the present disclosure, a method of sensing an arc in a gas insulated switchgear (GIS) may include: receiving, with an optical signal receiving unit, an optical signal generated due to an arc within a GIS; and outputting, with a circuit breaker controller, a circuit breaker interrupt signal based on the received optical signal, wherein the optical signal receiving unit is installed within the GIS.

The method may further include: when the received optical signal lasts for a predetermined period of time or longer or when the received optical signals are repeatedly generated, outputting, with the circuit breaker controller, the circuit breaker interrupt signal.

The method may further include: converting, with an optical signal converting unit, the received optical signal into a voltage signal; and amplifying, with an amplifying unit, the converted voltage signal at a predetermined amplification rate; and adjusting, with an offset adjusting unit, an offset of the amplified voltage signal.

The method may further include: generating an optical signal with an optical signal generating unit installed within the GIS.

The optical signal receiving unit may include a photodiode.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
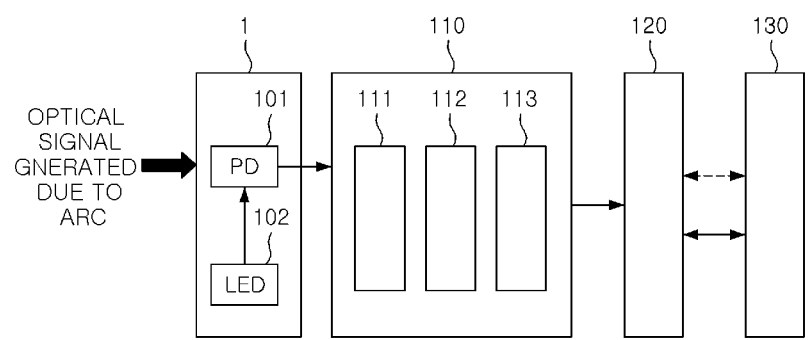
FIG. 1 is a view illustrating a configuration of an apparatus for sensing an arc in a gas insulated switchgear (GIS) according to an exemplary embodiment of the present disclosure.

Hereinafter, exemplary embodiments of the present disclosure will be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Figure 2A:
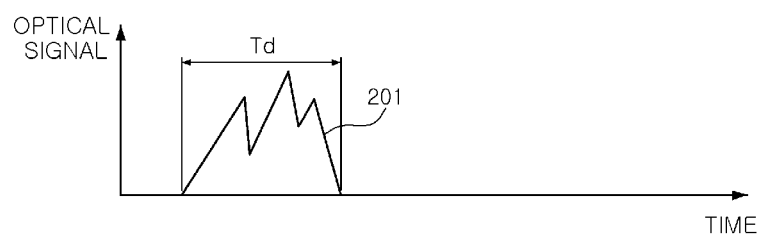
FIGS. 2A-2C are a view illustrating waveforms of various optical signals according to an exemplary embodiment of the present disclosure.
Figure 2B:
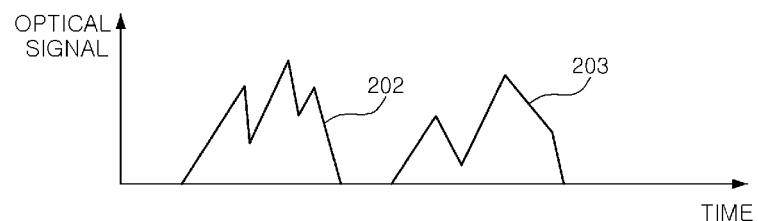
Figure 2C:
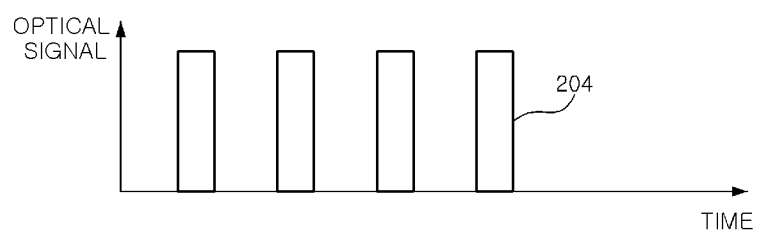

FIG. 1 is a view illustrating a configuration of an apparatus for sensing an arc in a gas insulated switchgear (GIS) according to an exemplary embodiment of the present disclosure, while FIGS. 2A-2C are a view illustrating waveforms of various optical signals according to an exemplary embodiment of the present disclosure.

An apparatus for sensing an arc (or an arc sensing apparatus) according to an exemplary embodiment of the present disclosure may include an optical signal receiving unit 101 receiving an optical signal generated due to an arc within a gas insulated switchgear (GIS) 1 and a circuit breaker controller 120 outputting a circuit breaker interrupt signal based on the received optical signal. Here, the optical signal receiving unit 101 may be installed within the GIS 1.

Hereinafter, the arc sensing apparatus of the GIS according to an exemplary embodiment of the present disclosure will be described in detail with reference to FIGS. 1 and 2A-2C.

As illustrated in FIG. 1, the GIS 1 is a device for performing a switching operation to interrupt a fault current as occurs, and an interior of the GIS 1 is filled with an $SF_6$ gas having excellent insulating and arc-extinguishing characteristics. When an abnormal current occurs, a circuit breaker within the GIS operates to block an electrical line and controls an arc generated at this time with the insulating gas.

The GIS may include the optical signal receiving 101 and an optical signal generating unit 102.

In detail, the optical signal receiving unit 101 is installed within the GIS 1 and receives an optical signal generated due to an arc. The received optical signal may be delivered to a signal processing unit 110. In an exemplary embodiment of the present disclosure, the optical signal receiving unit 101 may include a photodiode (PD), a type of optical sensor for receiving light.

The GIS 1 may also include the optical signal generating unit 102 in addition to the optical signal receiving unit 101. The optical signal generating unit 102 may be installed within the GIS 1 and generate an artificial optical signal. The generated optical signal may be received by the optical signal receiving unit 101. Namely, the optical signal generated by the optical signal generating unit 102 may not be generated due to an arc and may be a signal for determining whether the optical signal receiving unit 101 operates. In an exemplary embodiment of the present disclosure, the optical signal generating unit 102 may include a light emitting diode (LED).

The signal processing unit 110 may include an optical signal converting unit 111, an amplifying unit 112, and an offset adjusting unit 113.

The optical signal converting unit 111 of the signal processing unit 110 may convert an optical signal received from the optical signal receiving unit 101 into a voltage signal. Namely, a signal output from the photodiode PD is a weak current signal having a weak magnitude, and thus, the optical signal converting unit 111 converts the signal into a tractable voltage form. The converted voltage signal may be delivered to the amplifying unit 112.

The amplifying unit 112 of the signal processing unit 110 may amplify the converted voltage signal from the optical signal converting unit 111 at a predetermined amplification rate. The amplified voltage signal may be delivered to the offset adjusting unit 113.

The offset adjusting unit 113 of the signal processing unit 110 may adjust an offset of the amplified voltage signal from the amplifying unit 112. This is to adjust the amplified voltage signal to have a desired level, because a reference level of a signal delivered to the signal processing unit 110 differs.

The foregoing signal processing unit 110 is a block for processing the optical signal received by the optical signal receiving unit 101, and according to exemplary embodiments of the present disclosure, the optical signal received by the optical signal receiving unit 101 may be delivered directly to the circuit breaker controller 120. Based on the received optical signal, the circuit breaker controller 120 may output a circuit breaker interrupt signal.

In detail, when the received optical signal lasts for a predetermined period of time or longer or when optical signals are repeatedly generated, the circuit breaker controller 120 may output a circuit breaker interrupt signal.

Namely, as illustrated in FIG. 2A, when the received operation signal 201 lasts for a predetermined period of time Td or longer, the circuit breaker controller 120 may output a circuit breaker interrupt signal. The predetermined period of time Td may be 100 ms, but it will be obvious to a person skilled in the art that the numerical value is merely an example and may be substituted with any other value.

Also, as illustrated in FIG. 2B, the circuit breaker controller 120 may output a circuit breaker interrupt signal even when the received optical signals 202 and 203 are repeatedly generated. For example, when optical signals are generated ten times or more for a limited period of time, e.g., one second, the circuit breaker controller 120 may output a circuit breaker interrupt signal.

FIG. 2C illustrates an optical signal 204 arbitrarily generated by the optical signal generating unit 102, and as mentioned above, the optical signal 204 is a signal for determining whether the optical signal receiving unit 101 operates. The optical signal 204 may be generated in each predetermined period as illustrated in FIG. 2C. However, the optical signal 204 is only used to determine whether the optical signal receiving unit 101 operates and it will be obvious to a person skilled in the art that the optical signal 204 can be generated without a predetermined period.

Reference numeral 130 denotes an external server, and the circuit breaker controller 120 may transmit the received optical signal (or the circuit breaker interrupt signal) to the external server 130 through wired/wireless communications.

As described above, according to an exemplary embodiment of the present invention, since the optical signal receiving unit is installed within the GIS, an optical signal due to an arc can be received at the maximum level, and since the optical signal receiving unit is configured as a photodiode (PD), an arc generated within the GIS can be simply sensed at low cost.

Figure 3:
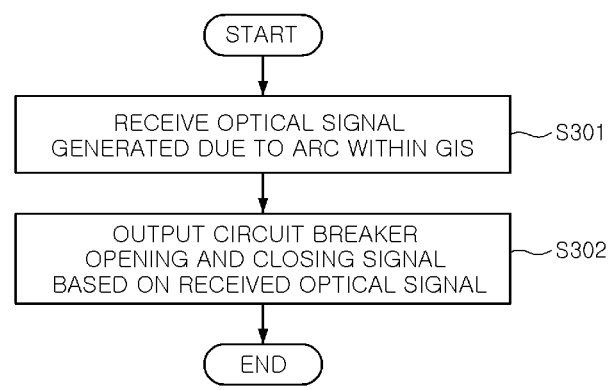
FIG. 3 is a flow chart illustrating a method of sensing an arc within a GIS according to another exemplary embodiment of the present disclosure.

FIG. 3 is a flow chart illustrating a method of sensing an arc within a GIS according to another exemplary embodiment of the present disclosure. Hereinafter, a method of sensing an arc within a GIS according to an exemplary embodiment of the present disclosure will be described with reference to FIGS. 1 though 3. However, redundant descriptions in relation to FIGS. 1 and 2A-2C will be omitted for the brevity of description.

Referring to FIGS. 1 through 3, first, the optical signal receiving unit 101 may be installed within the GIS 1 and receive an optical signal generated due to an arc in operation S301. According to an exemplary embodiment of the present disclosure, the light signal receiving unit 101 may include a photodiode (PD), a type of optical sensor for receiving light.

Next, the circuit breaker controller 120 may output a circuit breaker interrupt signal based on the received optical signal in operation S302.

In detail, when the received optical signal lasts for a predetermined period of time or longer or when optical signals are repeatedly generated, the circuit breaker controller 120 may output a circuit breaker interrupt signal.

Namely, when the received optical signal 201 lasts for a predetermined period of time Td or longer, as illustrated in FIG. 2A, the circuit breaker controller 120 may output a circuit breaker interrupt signal.

Also, when received optical signals 202 and 203 are repeatedly generated as illustrated in FIG. 2B, the circuit breaker controller 120 may output a circuit breaker interrupt signal.

Meanwhile, according to an exemplary embodiment of the present disclosure, the signal processing unit 110 for processing a received optical signal and an optical signal generating unit 102 installed within the GIS 1 to determine whether the optical signal receiving unit 101 operates may be further provided, and as mentioned above, the optical signal generating unit 102 may include a light emitting diode (LED).

As set forth above, according to exemplary embodiments of the present disclosure, by installing an optical signal receiving unit within a GIS, an optical signal due to an arc can be received at the maximum level, and by configuring the optical signal receiving unit as a photodiode, an arc generated within the GIS can be simply sensed at low costs.

While exemplary embodiments have been shown and described above, it will be apparent to those skilled in the art that modifications and variations could be made without departing from the scope of the present invention as defined by the appended claims.

What is claimed is:

1. An apparatus for sensing an arc in a gas insulated switchgear (GIS), the apparatus comprising:
    an optical signal receiving unit receiving an optical signal generated due to an arc within a GIS;
    a circuit breaker controller outputting a circuit breaker interrupt signal based on the received optical signal; and
    an optical signal generating unit installed within the GIS,
    wherein the optical signal receiving unit is installed within the GIS.

2. The apparatus of claim 1, wherein when the received optical signal lasts for predetermined period of time or longer or when the received optical signals are repeatedly generated, the circuit breaker controller outputs the circuit breaker interrupt signal.

3. The apparatus of claim 1, further comprising:
    an optical signal converting unit converting the received optical signal into a voltage signal;
    an amplifying unit amplifying the converted voltage signal at a predetermined amplification rate; and
    an offset adjusting unit adjusting an offset of the amplified voltage signal.

4. The apparatus of claim 1, wherein the optical receiving unit comprises a photodiode, and the optical signal generating unit comprises a light emitting diode (LED).

5. A method of sensing an arc in a gas insulated switchgear (GIS), the method comprising:
    receiving, with an optical signal receiving unit, an optical signal generated due to an arc within a GIS;
    outputting, with a circuit breaker controller, a circuit breaker interrupt signal based on the received optical signal; and
    generating an optical signal with an optical signal generating unit installed within the GIS,
    wherein the optical signal receiving unit is installed within the GIS.

6. The method of claim 5, further comprising: when the received optical signal lasts for a predetermined period of time or longer or when the received optical signals are repeatedly generated, outputting, with the circuit breaker controller, the circuit breaker interrupt signal.

7. The method of claim 5, further comprising:
    converting, with an optical signal converting unit, the received optical signal into a voltage signal; and
    amplifying, with an amplifying unit, the converted voltage signal at a predetermined amplification rate; and
    adjusting, with an offset adjusting unit, an offset of the amplified voltage signal.

8. The method of claim 5, wherein the optical receiving unit comprises a photodiode (PD), and the optical signal generating unit comprises a light emitting diode (LED).

* * * * *